United States Patent [19]

Shiobara et al.

[11] Patent Number: 5,190,995
[45] Date of Patent: Mar. 2, 1993

[54] NAPHTHALENE RING CONTAINING EPOXY RESIN COMPOSITION AND SEMICONDUCTOR DEVICE ENCAPSULATED THEREWITH

[75] Inventors: Toshio Shiobara, Annaka; Kazutoshi Tomiyoshi, Takasaki, both of Japan

[73] Assignee: Shin-Etsu Chemical Co., Ltd., Tokyo, Japan

[21] Appl. No.: 645,498

[22] Filed: Jan. 24, 1991

[30] Foreign Application Priority Data

Jan. 25, 1990 [JP] Japan .................... 2-15596

[51] Int. Cl.$^5$ ............................ C08L 63/04
[52] U.S. Cl. ........................ 523/443; 528/97; 525/476; 525/481; 525/482; 525/487; 523/466
[58] Field of Search ............ 528/97; 525/481, 482, 525/476; 523/443, 466

[56] References Cited

U.S. PATENT DOCUMENTS

| | | | |
|---|---|---|---|
| 3,290,269 | 12/1966 | O'Brochta | 528/97 |
| 4,376,147 | 3/1983 | Byrne et al. | 428/167 |
| 4,551,508 | 11/1985 | Urasaki | 528/88 |
| 4,720,515 | 1/1988 | Iji et al. | 525/476 |
| 4,876,324 | 10/1989 | Nakano et al. | 528/144 |
| 4,902,732 | 2/1990 | Itoh et al. | 525/476 |
| 4,908,424 | 3/1990 | Dewhirst et al. | 528/97 |
| 5,001,174 | 3/1991 | Yanagisawa et al. | 525/481 |
| 5,068,293 | 11/1991 | Kaji et al. | 528/97 |

FOREIGN PATENT DOCUMENTS

| | | |
|---|---|---|
| 218228 | 4/1987 | European Pat. Off. |
| 042967A1 | 6/1991 | European Pat. Off. |
| 63-226951 | 9/1988 | Japan |
| 3-000717A | 1/1991 | Japan |

OTHER PUBLICATIONS

Patent Abstracts of Japan; vol. 13, No. 23 (E-705)(3371) 19 Jan. 1989 & JP-A-63 226 951 (Shin-Etsu Chemical Co.) 21; Sep. 1988.
Patent Abstracts of Japan: vol. 10, No. 335 (C-384)(2391); 13 Nov. 1986 & JP-A-61 141 724 (Agency of Ind Science and Techn) 28 Jun. 1986.

Primary Examiner—Robert E. Sellers
Assistant Examiner—Frederick Krass
Attorney, Agent, or Firm—Birch, Stewart, Kolasch & Birch

[57] ABSTRACT

Epoxy resin compositions comprising (A) an epoxy resin of formula (1), (B) a curing agent based on a novolak type phenol resin and/or a triphenolalkane resin of formula (2), and (C) an inorganic filler are suitable for encapsulating semiconductor elements because they show good flow behavior upon casting and cure into less stressed products having improved mechanical strength, Tg, and moisture resistance.

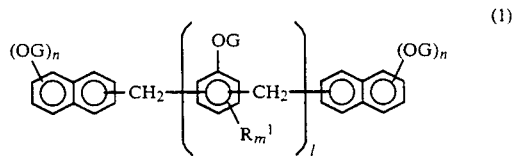

(1)

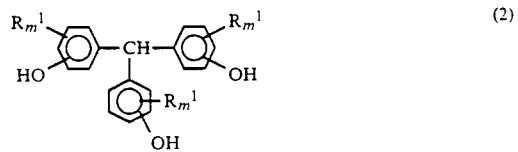

(2)

$R^1$ is a hydrogen atom or an alkyl group having 1 to 10 carbon atoms, OG is $$-O-CH_2-CH\underset{O}{\overset{}{\diagup\diagdown}}CH_2,$$

m is 0, 1 or 2, n is 1 or 2, and l is 0, 1, 2 or 3.

16 Claims, 1 Drawing Sheet

NAPHTHALENE RING CONTAINING EPOXY RESIN COMPOSITION AND SEMICONDUCTOR DEVICE ENCAPSULATED THEREWITH

This invention relates to an epoxy resin composition useful in semiconductor encapsulation and a semiconductor device encapsulated with such an epoxy resin composition in cured form.

BACKGROUND OF THE INVENTION

In general, epoxy resin compositions that comprise a curable epoxy resin, a curing agent and various additives, are superior in moldability, adherence, electric properties, mechanical properties, and moisture resistance as compared to other conventional thermosetting resins. Therefore, epoxy resin compositions are often used for the encapsulation of semiconductor devices.

The general trend in the advanced semiconductor device technology is to reduce the size and thickness of packages, although semiconductor elements have become of larger size. If such semiconductor elements are encapsulated with conventional epoxy resin compositions, larger stresses are applied to the semiconductor elements due to the difference in dimensional change between the elements and the compositions caused by changes in temperature. In addition, more or less moisture absorption can occur prior to soldering, causing cracks in the packages.

To overcome these problems, the same assignee as the present invention previously proposed several solutions; for example: an epoxy resin composition having an organopoly. siloxane blended in a curable epoxy resin as disclosed in U.S. Pat. No. 4,376,147, an epoxy resin composition having blended therein a block copolymer of an aromatic polymer and an organopolysiloxane as disclosed in U.S. Pat. No. 4,902,732, and a semiconductor device encapsulated with a composition comprising a novolak type phenol resin or triphenolalkane type phenol resin and an organopolysiloxane as disclosed in Japanese Patent Application Kokai No. 226951/1988. These epoxy resin compositions are of less stressing nature. Nevertheless, even these compositions cannot meet all the requirements for the encapsulation of advanced semiconductor devices.

At present, there is a need for the development of a semiconductor encapsulating resin composition which shows improved flow behavior upon casting and forms cured products having improved properties including mechanical strength such as flexural strength and flexural modulus, a high glass transition temperature, and moisture resistance in addition to the less stressing nature.

SUMMARY OF THE INVENTION

Therefore, an object of the present invention is to provide a new and improved epoxy resin composition which shows improved flow behavior and forms cured products having improved properties including low stress, a low coefficient of expansion, low moisture absorption, a high glass transition temperature, moisture resistance and high mechanical strength. Another object of the present invention is to provide a semiconductor device encapsulated with such an epoxy resin composition in cured form.

The inventors have found that when (A) an epoxy resin having a naphthalene ring of formula (1) defined below, (B) a curing agent based on a novolak type phenol resin and/or a triphenolalkane resin of formula (2) defined below, and (C) an inorganic filler are blended, or when these components (A) to (C) and (D) a block copolymer obtained through addition reaction between an organic polymer of formula (3) defined below and an organopolysiloxane of formula (4) defined below are blended, there is obtained an epoxy resin composition which shows improved flow behavior and cures to products having improved properties including low stress, a low coefficient of expansion, minimized moisture absorption, a high glass transition temperature, high moisture resistance, high mechanical strength, and good adherence. Therefore this epoxy resin composition can be applied to all types of semiconductor device including DIP, flat pack, PLCC, SO and other types. The composition has properties best suited for encapsulating such semiconductor devices. The present invention is predicated on this finding.

According to the present invention, there is provided an epoxy resin composition comprising:

(A) an epoxy resin of the general formula (1):

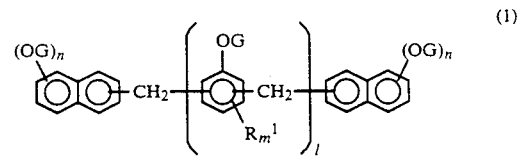

wherein $R^1$ is a hydrogen atom or an alkyl group having 1 to 10 carbon atoms,

OG is

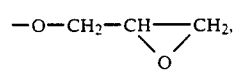

letter m is an integer of 0 to 2, n is equal to 1 or 2, and l is an integer of 0 to 3, (B) a curing agent based on a novolak type phenol resin and/or a triphenolalkane resin of the general formula (2):

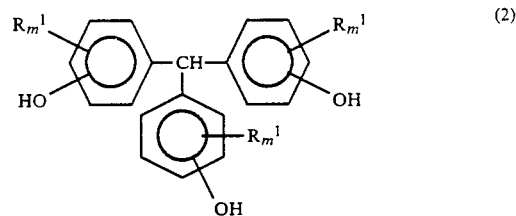

wherein $R^1$ and m are as defined above, and (C) an inorganic filler.

The composition may further include (D) a block copolymer obtained by addition reaction between an organic polymer of the general formula (3):

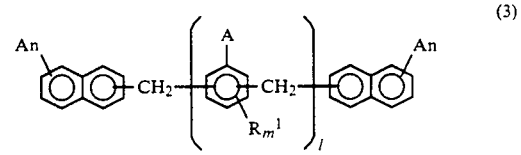

wherein A is independently selected from the group consisting of an —OH group, an —OG group, and an alkenyl-containing organic group having 1 to 10 carbon atoms, and $R^1$, OG, m, n and l are as defined above, and an organopolysiloxane of the general formula (4):

$$R^2{}_aR^3{}_bSiO_{(4-a-b)/2} \qquad (4)$$

wherein $R^2$ is a hydrogen atom or $-(CH_2)_p-NH_2$ wherein p is an integer of from 0 to 5, $R^3$ is a monovalent organic group having 1 to 10 carbon atoms, and letters a and b are numbers satisfying $0.001 \leq a \leq 1$, $1 \leq b \leq 3$, and $1.001 \leq a+b \leq 3$.

In another aspect, the present invention provides a semiconductor device encapsulated with a cured one of an epoxy resin composition as defined above.

BRIEF DESCRIPTION OF THE DRAWINGS

The above and other objects, features, and advantages of the present invention will be better understood from the following description taken in conjunction with the accompanying drawings, in which.

DESCRIPTION OF THE PREFERRED EMBODIMENT

Figure 1:
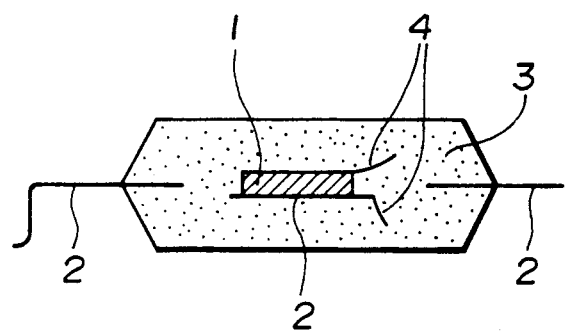
FIG. 1 is a cross sectional view of an SO package in a crack resistance (II) test by soldering after moisture absorption, showing cracks in the package.

As described above, the present invention provides an epoxy resin composition comprising (A) an epoxy resin, (B) a curing agent, and (C) an inorganic filler.

Component (A) is an epoxy resin of general formula (1).

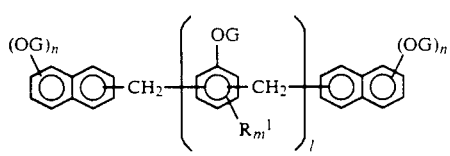
(1)

Due to the presence of a naphthalene ring this epoxy resin has a high glass transition temperature, minimized water absorption, and improved toughness.

In formula (1), $R^1$ is a hydrogen atom or an alkyl group having 1 to 10 carbon atoms, for example, methyl, ethyl, propyl, t-butyl, and octyl groups, OG, which may be attached to the outside and/or inside benzene ring of the naphthalene ring, is

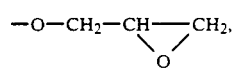

letter m is an integer of 0 to 2, n is equal to 1 or 2, and l is an integer of 0 to 3.

Several illustrative, non-limiting examples of the epoxy resin of formula (1) are given below.

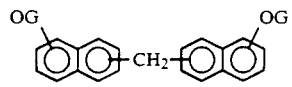

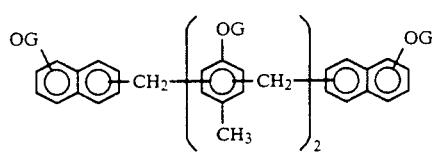

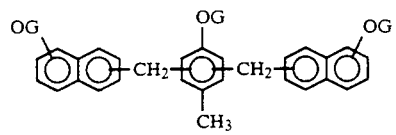

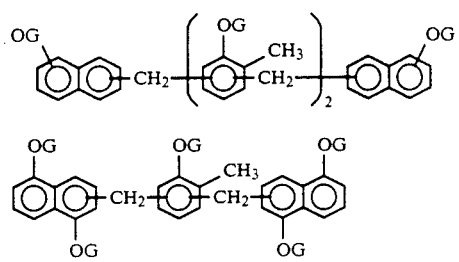

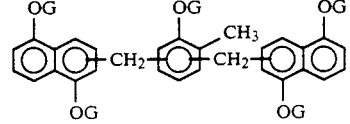

In these formulae, OG may be attached to the outside and/or inside benzene ring of the associated naphthalene ring at any desired position.

The epoxy resins may be used alone or in admixture of two or more.

The epoxy resins may be combined with other desired epoxy resins, for example, novolak type epoxy resins, bisphenol A type epoxy resins, substituted epoxy resins thereof having a halogen atom such as chlorine and bromine introduced therein, and monoepoxy compounds such as styrene oxide, cyclohexene oxide, and phenyl glycidyl ether.

The epoxy resins of formula (1) may be synthesized, for example, by reacting a naphthalene ring-bearing polymer having a phenolic hydroxyl group with epichlorohydrin.

Component (B) is a curing agent for epoxy resin (A) which predominantly comprises a novolak type phenol resin and/or a triphenolalkane resin.

Examples of the novolak type phenol resin are given below.

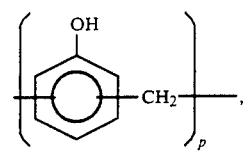

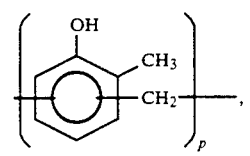

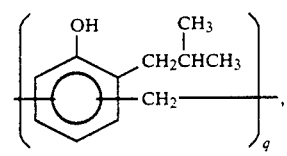

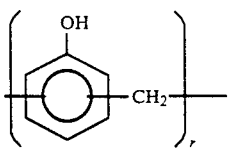

In these formulae, p is a positive number of from 2 to 15, and q and r are positive numbers, with the sum of q+r is equal to 2 to 15.

The triphenolalkane resin is of the general formula (2):

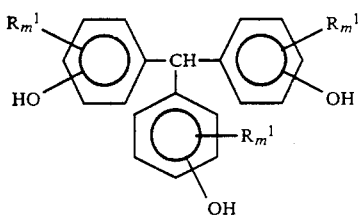

wherein $R^1$ and m are as defined above. Examples of the triphenolalkane resin are given below.

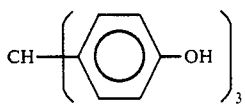

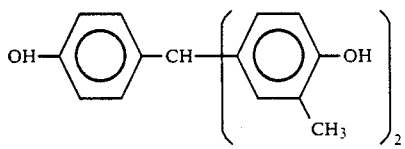

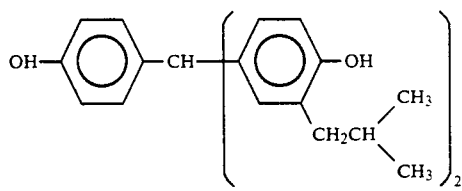

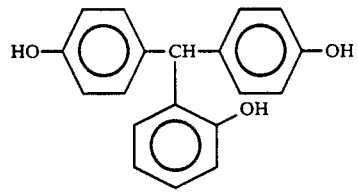

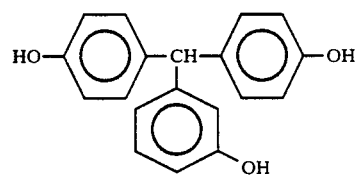

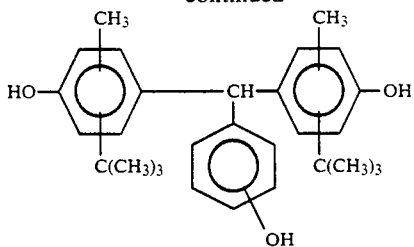

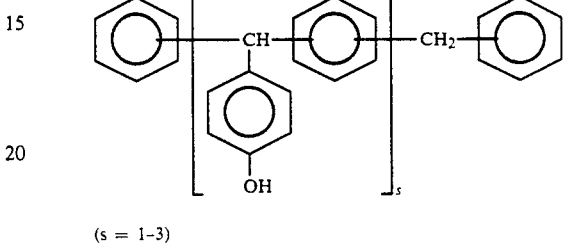

(s = 1-3)

Component (B) selects a member from the group consisting of a novolak type phenol resin and a triphenolalkane resin of formula (2) and mixtures thereof as a major ingredient of the curing agent for epoxy resin (A). Component (B) is used in an effective amount for curing the epoxy resin, preferably in such an amount that there is present 0.1 to 3 mol, more preferably 0.5 to 1.5 mol of the phenolic OH group of the phenol novolak resin and/or triphenolalkane resin per mol of the epoxy group in component (A). Outside this range, the composition would be less curable and become difficult to mold by transfer molding, for example.

If desired, the novolak type phenol resin or a triphenolalkane resin may be combined with another curing agent, for example, amine curing agents as typified by diaminodiphenylmethane, diaminodiphenylsulfone, and metaphenylenediamine, and acid anhydride curing agents such as phthalic anhydride, pyromellitic anhydride, and benzophenonetetracarboxylic anhydride.

Component (C) is an inorganic filler which is typically crystalline or amorphous quartz powder. Alumina, BN, silicon nitride, and aluminum nitride are also useful fillers. The quartz powder may be used in either spherical or ground form. A quartz powder in which the content of coarse particles having a diameter of more than 75 μm is limited to less than 0.3% by weight is preferred for the purpose of protecting semiconductor elements from local stresses. Also, a quartz powder containing 5 to 20 parts by weight of spherical silica having a mean diameter of 0.4 to 2 μm per 100 parts by weight of the quartz powder is desired for the purpose of improving the flow of the composition. These quartz powders may be surface treated with silane coupling agents prior to use.

The amount of component (C) blended preferably ranges from 350 to 700 parts by weight, more preferably from 400 to 650 parts by weight per 100 parts by weight of the total of components (A) and (B). Excess amounts of filler are difficult to disperse and would adversely affect the processability, stress and crack resistance of the composition. Resin compositions containing lesser amounts of filler would have an increased coefficient of expansion.

Preferably, the epoxy resin composition of the invention further includes (D) a block copolymer obtained by addition reaction between an organic polymer of formula (3) and an organopolysiloxane of formula (4) whereby the composition is further improved in crack resistance and other properties.

The organic polymer constituting block copolymer (D) is of the general formula (3):

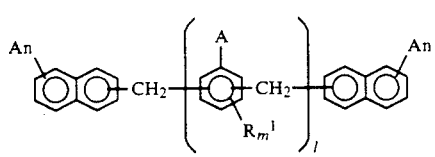

wherein A, which may be the same or different and be attached to the outside and/or inside benzene ring of the associated naphthalene ring at any desired position, is independently selected from the group consisting of an —OH group, an —OG group, and an alkenyl-containing organic group having 1 to 10 carbon atoms, and $R^1$, OG, m, n and l are as defined above. Examples of the $C_{1-10}$ organic group containing an alkenyl group include vinyl, allyl, and vinyl or allyl-containing groups as represented by the following formula.

Other alkenyl-containing organic groups may be used insofar as they can make addition reaction with an ≡SiH group of an organohydrogenpolysiloxane.

Several illustrative, non-limiting examples of the organic polymer of formula (3) are given below.

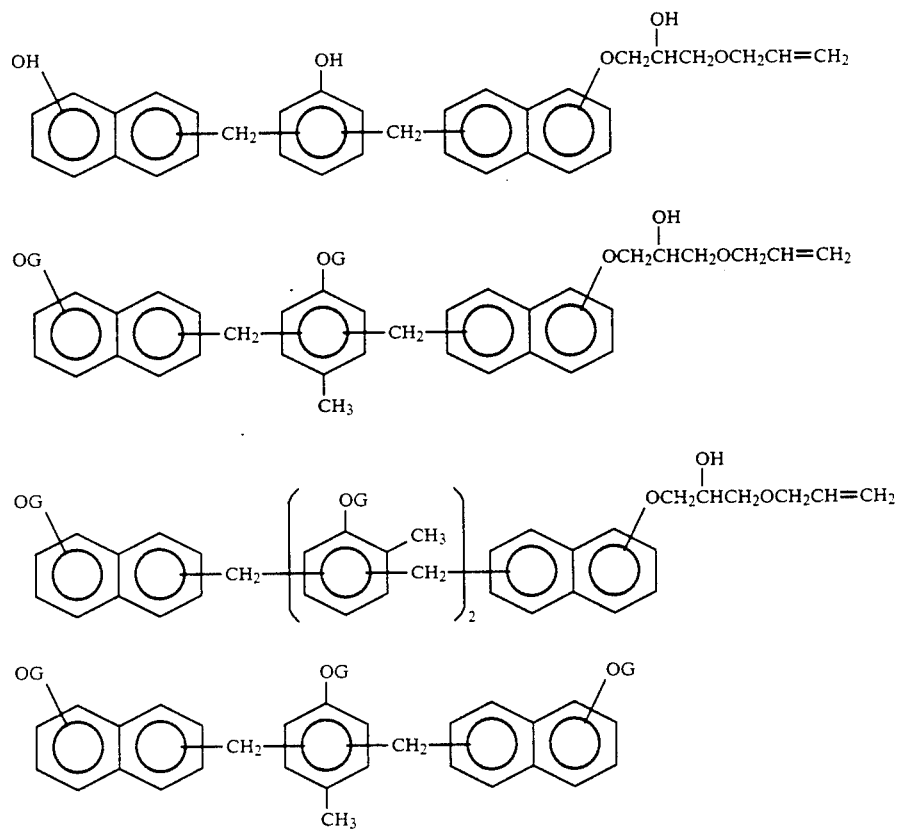

The organopolysiloxane is of the general formula:

wherein $R^2$ is a hydrogen atom or —$(CH_2)_p$—$NH_2$ wherein p is an integer of from 0 to 5, $R^3$ is a monovalent organic group having 1 to 10 carbon atoms, and letters a and b are positive numbers satisfying $0.001 \leq a \leq 1$, $1 \leq b < 3$, and $1.001 \leq a+b \leq 3$. This organopolysiloxane contains at least one ≡SiH group or ≡Si$(CH_2)_p$$NH_2$ group per molecule.

Preferred examples of the monovalent organic group represented by $R^3$ include a hydroxyl group and organic groups having 1 to 10 carbon atoms, for example, monovalent hydrocarbon groups such as methyl, ethyl, vinyl, phenyl and benzyl groups; substituted monovalent hydrocarbon groups such as chloropropyl, chloromethyl and glycidylpropyl groups; alkoxy groups such as methoxy and ethoxy groups; and alkenyloxy groups such as isopropenyloxy and isobutenyloxy groups. The groups represented by $R^3$ may be the same or different in formula (4).

Where $R^2$ is a hydrogen atom, the organopolysiloxanes of formula (4) are organohydrogenpolysiloxanes having a ≡SiH group which include double end hydrogenmethylpolysiloxanes and double end hyirogenmethyl-(2-trimethoxysilylethyl)polysiloxanes, examples of which are given below.

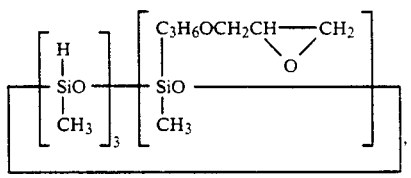

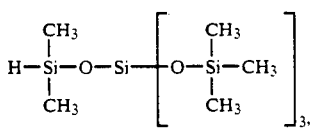

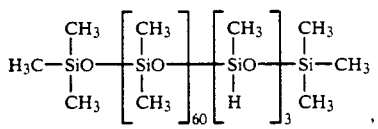

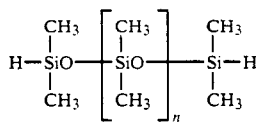

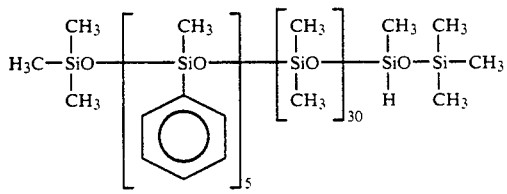

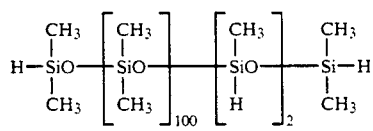

In the formula, n is an integer of 0 to 1000.

Further, the organopolysiloxanes of formula (4) wherein $R^2$ is a —$(CH_2)_p$—$NH_2$ group are organopolysiloxanes having an ≡Si—$(CH_2)_p$—$NH_2$ group, which include the following compounds.

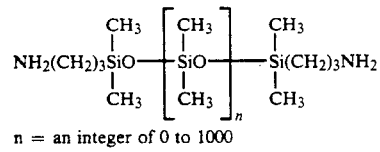

n = an integer of 0 to 1000

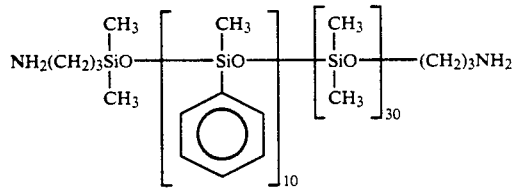

Component (D) or block copolymer can be obtained by addition reaction between an organic polymer having an alkenyl group and an organopolysiloxane having an ≡SiH group or addition reaction between an organic polymer having an epoxy group and an organopolysiloxane having a —$(CH_2)_p$—$NH_2$ group.

The addition reaction may be effected by conventional well-known methods. For example, addition reaction between an alkenyl group and an ≡SiH group may be carried out in an inert solvent such as benzene, toluene, and methyl isobutyl ketone in the presence of a conventional well-known addition catalyst such as a platinum catalyst, typically chloroplatinic acid by heating the system at a temperature of 60° to 120° C. The reactants are preferably added such that the molar ratio of alkenyl group/≡SiH group is at least 1, preferably 1 to 10, more preferably 1.5 to 10.

Also, addition reaction between an epoxy group and a —$(CH_2)_p$—$NH_2$ group may be carried out in an inert solvent such as toluene and methyl isobutyl ketone or without a solvent, by heating the system at a temperature of 60° to 170° C.

Component (D) may be a block copolymer alone or a mixture of two or more block copolymers. The amount of component (D) blended preferably ranges from 2 to 50 parts by weight per 100 parts by weight of the total of components (A) and (B). Less than 2 parts of the block copolymer would be insufficient to improve the crack resistance of the composition whereas more than 50 parts would adversely affect mechanical strength.

Preferably, components (A), (B) and (D) are blended such that the ratio of the content of epoxy group (a mol) to the content of phenolic hydroxyl group (b mol) contained therein may be in the range of a/b=0.5 to 1.5. With a/b outside this range, curing property, low stress and other physical properties are sometimes lost.

A curing catalyst may be blended in the epoxy resin composition of the invention. The curing catalysts used herein include imidazoles, tertiary amines, and phosphorus compounds although the preferred curing catalysts are mixtures of 1,8-diazabicyclo(5.4.0)undecene-7 and triphenylphosphine in a weight ratio of from 0:1 to 1:1, especially from 0.01:1 to 0.5:1. A higher proportion of 1,8-diazabicyclo(5.4.0)undecene-7 beyond this range would sometimes lead to a lower glass transition temperature. The amount of the curing catalyst added is not particularly limited although it is preferably added in an amount of 0.2 to 2 parts, more preferably 0.4 to 1.2 parts by weight per 100 parts by weight of the total of components (A) and (B).

The composition of the invention may further contain various well-known additives if desired. Exemplary additives include stress lowering agents such as reactive or non-reactive thermoplastic elastomers, silicone gel, silicone rubber, and silicone oil, mold release agents such as waxes and fatty acids (e.g., stearic acid) and metal salts thereof, pigments such as carbon black, flame retardants, surface treating agents such as γ-glycidoxypropyltrimethoxysilane, coupling agents such as epoxysilanes, vinylsilanes, boron compounds and alkyl titanates, antioxidants, other additives, and mixtures thereof.

The epoxy resin compositions of the invention may be prepared by mixing and agitating the necessary components uniformly, and milling the mixture in milling means preheated at 70° to 95° C., for example, a kneader, roll mill and extruder, followed by cooling and comminution. The order of mixing the components is not critical.

The compositions of the invention are advantageously applicable in encapsulating various types of semiconductor device including DIP, flat pack, PLCC, and SO types. The compositions can be molded by conventional methods including transfer molding, injection molding, and casting. Most often, the epoxy resin compositions are molded at a temperature of about 150° to about 180° C. and post cured at a temperature of about 150° to about 180° C. for about 2 to about 16 hours.

The epoxy resin compositions of the invention comprising the specific components in admixture as defined above flow well and cure into low stressed products having a low coefficient of linear expansion, low moisture absorption, a high glass transition temperature, high moisture resistance, and high mechanical strength. Therefore, the semiconductor devices encapsulated with the epoxy resin compositions are highly reliable.

EXAMPLE

Examples of the present invention are give below together with comparative examples, by way of illustration and not by way of limitation. All parts are by weight.

EXAMPLES 1-8 AND COMPARATIVE EXAMPLES 1-4

Epoxy resin compositions were prepared by uniformly melt mixing the components shown in Table 1 in a hot tworoll mill, cooling and comminuting the mixtures.

For these compositions, the following tests (A) to (I) were carried out. The results are shown in Table 1.

(A) Spiral flow

Using a mold according to the EMMI standard, measurement was made at 180° C. and 70 kg/cm².

(B) Flexural strength and Flexural modulus

Test bars of 10×4×100 mm were molded at 180° C. and 70 kg/cm² for 2 minutes according to JIS K6911 and post cured at 180° C. for 4 hours.

(C) Coefficient of linear expansion (μ) and Glass transition temperature (Tg)

Using a dilatometer, test pieces of 4 mm in diameter and 15 mm long were examined by heating the test pieces at a rate of 5° C./min.

(D) Crack resistance

Silicon chips of 9.0×4.5×0.5 mm were bonded to 14PIN-IC frames (42 alloy) and then encapsulated with the epoxy resin compositions by molding at 180° C. for 2 minutes and post curing at 180° C. for 4 hours. The packages were subjected to a thermal cycling test between −196° C.×1 min. and 260° C.×30 sec. The percent occurrence of cracks in the resin was determined at the end of 300 cycles. The result is an average of fifty samples.

(E) Crack resistance (I) upon soldering after moisture absorption

Silicon chips of 8.0×10.0×0.5 mm were bonded to flat packages of 10×14×2.3 mm and then encapsulated with the epoxy resin compositions by molding at 180° C. for 2 minutes and post curing at 180° C. for 4 hours. The packages were allowed to stand in a hot humid atmosphere at 85° C. and RH 85% for 72 hours and then immersed in a solder bath at 240° C. to determined the time (in second) taken until occurrence of cracks in the package.

(F) Crack resistance (II) upon soldering after moisture absorption

Silicon chips of 2×4×0.4 mm were bonded to SO frames of 4×12×1.8 mm and then encapsulated with the epoxy resin compositions by molding at 175° C. for 2 minutes and post curing at 180° C. for 4 hours. The packages were allowed to stand in a hot humid atmosphere at 85° C. and RH 85% for 72 hours and then immersed in a solder bath at 260° C. Then the packages were disintegrated to observe the occurrence of internal cracks under a light microscope.

FIG. 1 shows the package used in this test as comprising a silicon chip 1, a frame 2, and an encapsulating resin 3. Cracks 4 develop in the resin 3.

(G) Adhesion

Figure 2:
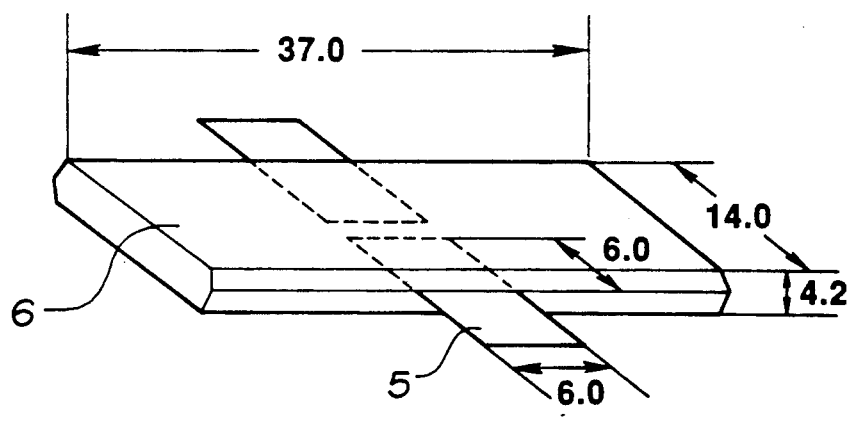
FIG. 2 is a perspective view of a package used in an adhesion test.

FIG. 2 shows a package used in this test as comprising a frame 5 encapsulated with a resin 6, with the dimensions indicated in mm. The frame was of 42 alloy and 0.25 mm thick. The package was prepared by molding the encapsulating resin on the frame at 175° C. for 2 minutes and post curing at 180° C. for 4 hours. The force required to withdraw the frame from the package was measured.

(H) Moisture resistance

Silicon chips of 9.0×4.5×0.5 mm were bonded to PLCC frames with 20 pins and then encapsulated with the epoxy resin compositions by molding at 180° C. for 2 minutes and post curing at 180° C. for 4 hours. The packages were allowed to stand in a hot humid atmosphere at 130° C. and RH 85% while a bias voltage of 20 volts was applied thereacross. The percent rejection due to Al corrosion was measured after 100 hours.

(I) Water absorption

Disks of 50 mm in diameter and 2 mm thick were molded at 180° C. and 70 kg/cm² for 2 minutes and post cured at 180° C. for 4 hours. The disks were subjected to a pressure cooker test (PCT) at 121° C./100% for 24 hours before the water absorption (percent) was measured.

TABLE 1

|  | Example 1 | Example 2 | Comparative Example 1 | Comparative Example 2 | Example 3 | Example 4 | Example 5 | Example 6 | Comparative Example 3 | Comparative Example 4 | Example 7 | Example 8 |
|---|---|---|---|---|---|---|---|---|---|---|---|---|
| Composition (pbw) | | | | | | | | | | | | |
| Epoxy resin (I) | 59.9 | — | — | — | 63.1 | 41.8 | 43.0 | 19.3 | — | — | — | — |
| Epoxy resin (II) | — | 58.4 | — | — | — | — | — | — | — | — | 42.3 | 42.3 |
| Epoxy resin (III) | — | — | 58.2 | — | — | — | — | — | 41.8 | — | — | — |
| Epoxy resin (IV) | — | — | — | 54.3 | — | — | — | — | — | 39.0 | — | — |
| Epoxy resin (V) | 8 | 8 | 8 | 8 | 8 | 8 | 8 | 8 | 8 | 8 | 8 | 8 |
| Curing agent (I) | 32.1 | 33.6 | 33.8 | 37.7 | — | 30.2 | 29.0 | 29.7 | 30.2 | 33.0 | — | — |
| Curing agent (II) | — | — | — | — | 28.9 | — | — | — | — | — | 28.7 | 28.7 |
| Block copolymer (I) | — | — | — | — | — | 20 | — | — | — | — | — | — |
| Block copolymer (II) | — | — | — | — | — | — | 20 | — | 20 | 20 | — | — |
| Block copolymer (III) | — | — | — | — | — | — | — | 43 | — | — | 21 | 21 |
| Curing catalyst (I) | 0.6 | 0.6 | 0.6 | 0.6 | 0.6 | 0.6 | 0.6 | 0.6 | 0.6 | 0.6 | 0.6 | 0.6 |

TABLE 1-continued

|  | Example 1 | Example 2 | Comparative Example 1 | Comparative Example 2 | Example 3 | Example 4 | Example 5 | Example 6 | Comparative Example 3 | Comparative Example 4 | Example 7 | Example 8 |
|---|---|---|---|---|---|---|---|---|---|---|---|---|
| Triphenylphosphine | 0.5 | 0.5 | 0.5 | 0.5 | 0.5 | 0.5 | 0.5 | 0.5 | 0.5 | 0.5 | 0.5 | 0.5 |
| Quartz powder (I) | 250 | 250 | 250 | 250 | 250 | 250 | 250 | 250 | 250 | 250 | — | — |
| Quartz powder (II) | 250 | 250 | 250 | 250 | 250 | 250 | 250 | 250 | 250 | 250 | — | — |
| Quartz powder (III) | 70 | 70 | 70 | 70 | 70 | 70 | 70 | 70 | 70 | 70 | — | — |
| Quartz powder (IV) | — | — | — | — | — | — | — | — | — | — | 600 | 650 |
| $Sb_2O_3$ | 8 | 8 | 8 | 8 | 8 | 8 | 8 | 8 | 8 | 8 | 8 | 8 |
| Carbon black | 1.5 | 1.5 | 1.5 | 1.5 | 1.5 | 1.5 | 1.5 | 1.5 | 1.5 | 1.5 | 1.5 | 1.5 |
| Carnauba wax | 1 | 1 | 1 | 1 | 1 | 1 | 1 | 1 | 1 | 1 | 1 | 1 |
| γ-glycidoxypropyl-trimethoxysilane | 3 | 3 | 3 | 3 | 3 | 3 | 3 | 3 | 3 | 3 | 3 | 3 |
| Properties | | | | | | | | | | | | |
| Spiral flow, inch | 35 | 35 | 33 | 32 | 32 | 32 | 30 | 32 | 30 | 32 | 30 | 30 |
| Flexural strength, $kg/mm^2$ | 13.5 | 13.5 | 13.5 | 13.2 | 13.4 | 13.2 | 13.0 | 13.2 | 13.2 | 13.2 | 14.0 | 14.0 |
| Flexural modulus, $kg/mm^2$ | 1450 | 1450 | 1450 | 1450 | 1450 | 1340 | 1350 | 1350 | 1350 | 1350 | 1550 | 1600 |
| Tg, °C. | 170 | 170 | 165 | 180 | 183 | 168 | 170 | 170 | 160 | 179 | 180 | 182 |
| μ, $10^{-5}$/°C. | 1.3 | 1.3 | 1.4 | 1.4 | 1.0 | 1.0 | 1.0 | 1.0 | 1.1 | 1.1 | 0.9 | 0.8 |
| Crack resistance, % | 5 | 5 | 10 | 10 | 0 | 0 | 0 | 0 | 0 | 0 | 0 | 0 |
| Crack resistance (I), sec. | 20 | 20 | 10 | 8 | 20 | 20 | 20 | 19 | 9 | 7 | 25 | 25 |
| Crack resistance (II) | No | No | Yes | Yes | No | No | No | No | Yes | Yes | No | No |
| Moisture resistance, % | 0 | 0 | 0 | 0 | 0 | 0 | 0 | 0 | 0 | 0 | 0 | 0 |
| Adhesion, kg | 45 | 45 | 40 | 41 | 50 | 48 | 45 | 49 | 42 | 43 | 47 | 47 |
| Water absorption, % | 0.42 | 0.44 | 0.52 | 0.62 | 0.47 | 0.50 | 0.44 | 0.47 | 0.55 | 0.65 | 0.45 | 0.43 |

| Epoxy resins | | Epoxy equivalent | Softening point |
|---|---|---|---|
| (I) | 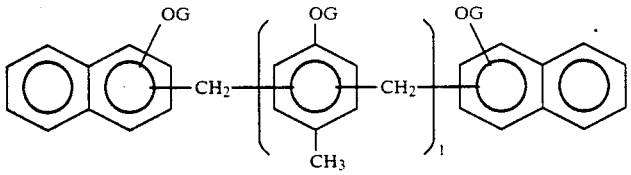 | 215 | 70 |

The number suffixed to the parenthesis is an average value.

| | | | |
|---|---|---|---|
| (II) | 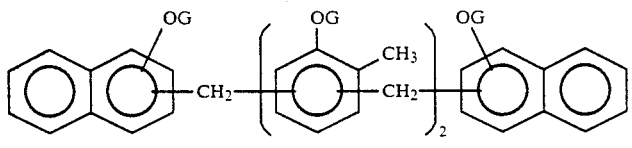 | 200 | 75 |

The number suffixed to the parenthesis is an average value.

| (III) | Ortho-cresol novolak type epoxy resin EOCN1020-65 (Nihon Kayaku K.K.) | 198 | 65 |
| (IV) | Triphenolalkane type epoxy resin EPPN501 (Nihon Kayaku K.K.) | 164 | 58 |
| (V) | Brominated epoxy resin BREN-S (Nihon Kayaku K.K.) | 280 | 80 |

| Curing Agents | | Phenol equivalent |
|---|---|---|
| (I) | Phenol novolak resin KH3488 (Dai-Nihon Ink K.K.) | 110 |
| (II) | Triphenolalkane 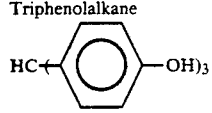 | 94 |

Block copolymers (I) An addition reaction product (organopolysiloxane content 34% by weight, epoxy equivalent 310) of the following two units.

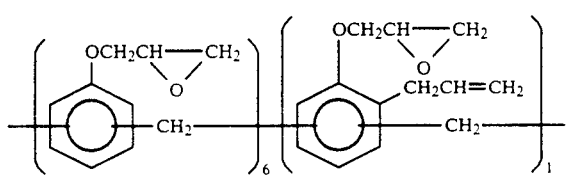

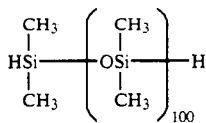

The numbers suffixed to the parentheses are average values.

(II) An addition reaction product (organopolysiloxane content 34% by weight, epoxy equivalent 410) of the following two units.

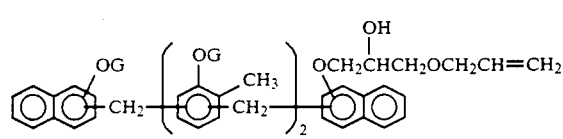

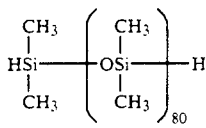

The numbers suffixed to the parentheses are average values.

(III) An addition reaction product (organopolysiloxane content 16% by weight, epoxy equivalent 260) of the following two units.

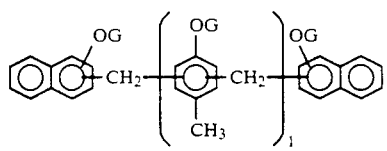

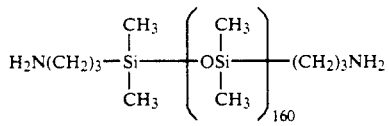

The numbers suffixed to the parentheses are average values.

Curing catalyst

It was prepared by mixing 1,8.diazabicyclo(5.4.0)-undecene-7 and phenol novolak resin TD2131 (manufactured by Dai-Nihon Ink K.K.) in a weight ratio of 20/80, heat melting them at 130° C. for 30 minutes, and comminuting to a size of less than 50 μm.

Quartz powders (I) Spherical fused silica having a specific surface are of 1.4 m²/g and a mean particle size of 15 μm (the content of coarse particles of more than 75 μm being less than 0.1 wt %).

(II) Ground fused silica having a specific surface are of 2.5 m²/g and a mean particle size of 10 μm (the content of coarse particles of more than 75 μm being 0.1 wt %).

(III) Spherical fused silica having a specific surface are of 10 m²/g and a mean particle size of 1.0 μm.

(IV) Fused silica in the form of a mixture of spherical silica having a specific surface are of 1.0 m²/g and a mean particle size of 30 μm (the content of coarse particles of more than 75 μm being 0.1 wt %), ground silica having a specific surface are of 3.2 m²/g and a mean particle size of 8 μm (the content of coarse particles of more than 75 μm being 0.1 wt %), and quartz powder (III) in a weight ratio of 70:20:10, the mixture being surface treated with 0.60% by weight of γ-glycidoxypropyltrimethoxysilane.

As seen from Table 1, the compositions within the scope of the present invention are free flowing and cure to products having high Tg, improved crack resistances (I) and (II) upon soldering after moisture absorption, increased adhesion, and minimized water absorption.

Although some preferred embodiments have been described, many modifications and variations may be made thereto in the light of the above teachings. It is therefore to be understood that within the scope of the appended claims, the invention may be practiced otherwise than as specifically described.

We claim:

1. An epoxy resin composition comprising
(A) an epoxy resin of the general formula:

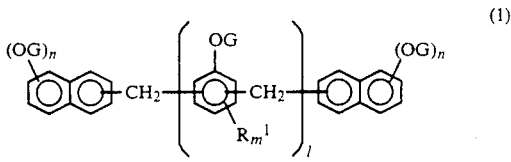

wherein $R^1$ is a hydrogen atom or an alkyl group having 1 to 10 carbon atoms,
OG is

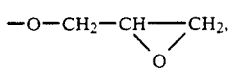

letter m is an integer of 0 to 2, n is equal to 1 or 2, and l is an integer of 0 to 3,
(B) a curing agent based on a novolak phenol resin and/or a triphenolalkane compound of the general formula:

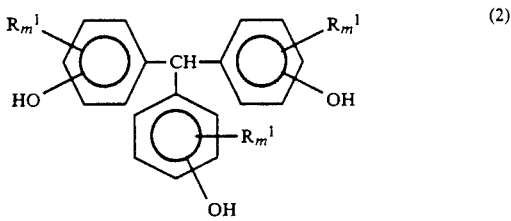

wherein $R^1$ and m are as defined above, and
(C) an inorganic filler, wherein 350 to 700 parts by weight of component (C) are present per 100 parts by weight of the total of components (A) and (B).

2. The composition of claim 1 which further comprises (D) a block copolymer obtained by addition reaction between an organic polymer of the general formula:

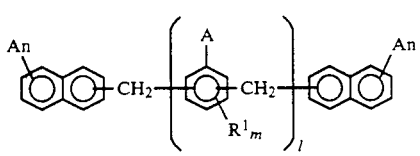  (3)

wherein A is independently selected from the group consisting of an —OH group, an —OG group, and an alkenyl-containing organic group having 1 to 10 carbon atoms, and $R^1$, OG, m, n and l are as defined above, and an organopolysiloxane of the general formula:

$R^2_a R^3_b SiO_{(4-a-b)/2}$  (4)

wherein $R^2$ is a hydrogen atom or $-(CH_2)_p-NH_2$ wherein p is an integer of from 0 to 5, $R^3$ is a monovalent organic group, and letters a and b are positive numbers satisfying $0.001 \leq a \leq 1$, $1 \leq b < 3$, and $1.001 \leq a+b \leq 3$.

3. The composition of claim 2 wherein 350 to 700 parts by weight of component (C) and 2 to 50 parts by weight of component (D) are present per 100 parts by weight of the total of components (A) and (B).

4. A semiconductor device encapsulated with a cured epoxy resin composition as set forth in any one of claims 1, 2 or 3.

5. The composition of claim 1, wherein 450 to 650 parts by weight component (C) is contained per 100 parts by weight of the total components (A) and (B).

6. The composition of claim 1, wherein said inorganic filler comprises quartz powder.

7. The composition of claim 6, wherein said quartz powder contains less than 0.3% by weight of particles having a diameter of greater than 75 μm.

8. The composition of claim 6, wherein said inorganic filler further comprises 5 to 20 parts by weight of a spherical silica having a mean diameter of 0.4 to 2 μm, per 100 parts by weight of said quartz powder.

9. The composition according to claim 1, wherein said composition further comprises a curing catalyst selected from the group consisting of tertiary amines and phosphorus compounds.

10. The composition according to claim 1, wherein said composition further comprises a curing catalyst comprising a mixture of 1,8-diazabicyclo(5.4.0)undecene-7 and triphenylphospine.

11. The composition according to claim 1, wherein said composition further comprises a curing catalyst selected from the group consisting of imidazoles.

12. The composition according to claim 1, wherein the mol ratio of the phenolic OH groups contained in (B) to the epoxy groups contained in (A) is 0.1:1 to 3:1.

13. The composition according to claim 12, wherein the mol ratio of the phenolic OH groups contained in (B) to the epoxy groups contained in (A) is 0.5:1 to 1.5:1.

14. The composition according to claim 2, wherein the mol ratio of the epoxy groups contained in (A) to the phenolic OH groups contained in (B) is 0.5:1 to 1.5:1.

15. The composition according to claim 1, wherein said novolak phenol resin (B) is selected from the group consisting of:

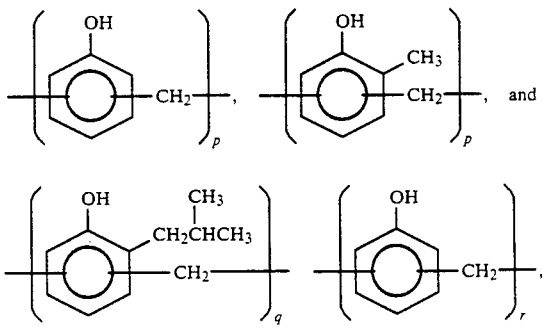

wherein p is a positive number of from 2 to 15, and q and r are positive numbers, with the sum of q+r being equal to 2 to 15.

16. The composition according to claim 1, wherein said epoxy resin of general formula (1) is selected from the group consisting of:

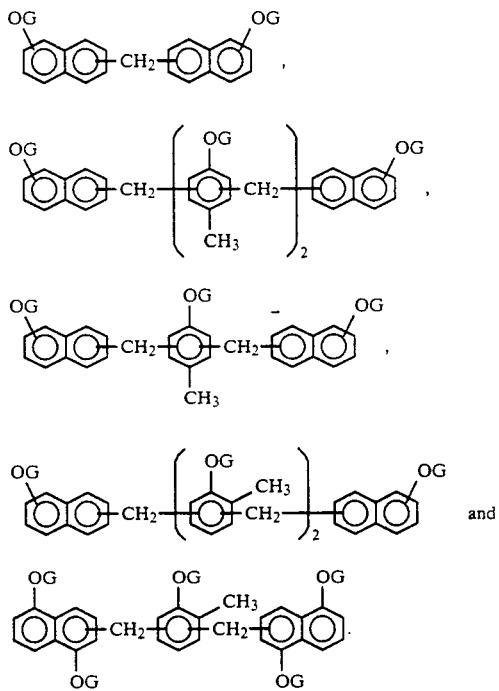

* * * * *